(12) United States Patent
Chang et al.

(10) Patent No.: US 6,281,115 B1
(45) Date of Patent: Aug. 28, 2001

(54) SIDEWALL PROTECTION FOR A VIA HOLE FORMED IN A PHOTOSENSITIVE, LOW DIELECTRIC CONSTANT LAYER

(75) Inventors: Chung Liang Chang; Lai-Juh Chen, both of Hsinchu (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 09/192,450

(22) Filed: Nov. 16, 1998

(51) Int. Cl.[7] .................. H01L 21/4768; H01L 21/44; H01L 21/311

(52) U.S. Cl. ................. 438/637; 438/618; 438/622; 438/623; 438/672; 438/675; 438/700

(58) Field of Search .................... 438/781, 780, 438/778, 763, 639, 637, 640, 631, 618, 622, 623, 624, 672, 675, 688, 687, 700

(56) References Cited

U.S. PATENT DOCUMENTS

| | | | |
|---|---|---|---|
| 5,284,801 | * 2/1994 | Page et al. | 438/623 |
| 5,370,904 | 12/1994 | Mine et al. | 427/126.2 |
| 5,393,702 | 2/1995 | Yang et al. | 438/639 |
| 5,459,086 | 10/1995 | Yang | 438/124 |
| 5,472,913 | * 12/1995 | Havemann et al. | 437/195 |
| 5,552,344 | * 9/1996 | Jang et al. | 438/624 |
| 5,559,055 | 9/1996 | Chang et al. | 438/586 |
| 5,854,302 | * 12/1998 | Foster et al. | 522/172 |

OTHER PUBLICATIONS

Chu et al, Direct Patterning low–k Material for Damascene Process, DUMIC Conference 1997, Library of Congress No. 89–644090, pp. 93–97, Feb. 11, 1997.*

Strandjord et al, Photosensitive Benzocyclobutene for Stress Buffer and Passivation Applications (One Mask Manufacturing Process), 1997, Electronic Components and Technology Conference, pp. 1260–1268, May 21, 1997.*

Kim et al, Modeling of Via Formation by photosensitive Dielectric Materials for MCM Applications, Proceedings of the 5th International Conference on Properties and Applications of Dielectric Materials, pp. 930–933, Feb. 11, 1997.*

Korczynski, "Low K dielectric integration cost modeling", Solid State Technology Oct. 1997, pp. 123–128.

* cited by examiner

Primary Examiner—Chandra Chaudhari
Assistant Examiner—Thanhha Pham
(74) Attorney, Agent, or Firm—George O. Saile; Stephen B. Ackerman

(57) ABSTRACT

A method for forming a via hole, in an insulator layer, without the use of photoresist procedures, has been developed. A photosensitive, low dielectric constant layer, is used as an interlevel insulator layer, between metal interconnect structures. Direct exposure, of a specific region of the photosensitive, low dielectric constant layer, converts the a specific region of the photosensitive, low dielectric constant layer, to a material that remains insoluble in a specific solution, while an unexposed region, of the same layer, can be selectively removed, creating the desired via hole. A silicon oxide deposition, and an anisotropic dry etch procedure, are employed to protect exposed surfaces of the photosensitive, low dielectric constant layer, in the form of silicon oxide spacers, formed on the sides of the via hole, and a silicon oxide layer, overlaying the top surface of the photosensitive, low dielectric constant layer.

18 Claims, 5 Drawing Sheets

SIDEWALL PROTECTION FOR A VIA HOLE FORMED IN A PHOTOSENSITIVE, LOW DIELECTRIC CONSTANT LAYER

BACKGROUND OF THE INVENTION

(1) Field of the Invention

The present invention relates to processes used to fabricate semiconductor devices, and more specifically to a process used to create a via hole, in a dielectric layer, exposing an underlying conductive structure.

(2) Description of Prior Art

The semiconductor industry is continually striving to increase the performance of semiconductor devices, while still maintaining, or even reducing the manufacturing costs of these higher performing semiconductor devices. The ability of the industry to fabricate devices with sub-micron features, or micro-miniaturization, has allowed the performance and cost objectives to be successfully addressed. Smaller device features allow a reduction of performance degrading resistances and capacitances to be realized, resulting in performance improvements. In addition the use of sub-micron device features, allows a greater number of smaller semiconductor chips, still possessing device densities comparable to device densities obtained with larger counterparts, to be obtained from a specific size starting substrate, thus resulting in a reduction of the processing cost for a specific semiconductor chip.

The arrival of micro-miniaturization has been attributed to advances in specific semiconductor fabrication disciplines, such as photolithography and dry etching. The use of more sophisticated exposure cameras, as well as the development of more sensitive photosensitive materials, have allowed sub-micron images to be routinely formed in photoresist layers. In addition the development of more advanced dry etching tools, and processes, have allowed the sub-micron images in photoresist layers, to be successfully transferred to underlying materials, used to create advanced semiconductor devices. However in addition to advances in semiconductor fabrication disciplines, optimization of specific fabrication sequences are still needed to further reduce the manufacturing costs for semiconductor devices.

One area of semiconductor fabrication, via hole formation, has been addressed regarding cost and performance optimization. As device dimensions shrink, processes used to open sub-micron via holes in dielectric layers, become more difficult to achieve. Sub-micron images in photoresist layers, used as masks for subsequent dry etching of the sub-micron via holes, are costly process steps, and can result in unwanted damage to exposed metal surfaces, occurring from processes, and reactants, used to remove the masking photoresist shape, at the conclusion of via hole formation. This invention will describe a novel process for forming a via hole in a dielectric layer, exposing an underlying metal interconnect structure, however this invention will feature a via hole opening procedure, without the use of costly photoresist procedures. A via hole is formed in a photosensitive, low dielectric constant layer, using direct exposure, and selective removal of the exposed region. However unlike the conventional photoresist processes, the photosensitive, low dielectric constant layer is not removed, and after filling the via hole with metal, the photosensitive, low dielectric constant layer remains to function as an interlevel dielectric layer, located between underlying and overlying, metal interconnect structures. An option offered in this invention is the creation of chemically vapor deposited, insulator spacers, on the sides of the via hole, to protect the exposed sides of the photosensitive, low dielectric constant layer, from subsequent processing steps. Prior art, such as Chang et al, in U.S. Pat No. 5,559,055, describe the use of low dielectric constant materials to fill spaces between metal lines, however they do not describe the use of a photosensitive, low dielectric constant layer, used as an interlevel dielectric layer, as well as a material used for via hole formation, without the use of photosensitive photoresist materials.

SUMMARY OF THE INVENTION

It is an object of this invention to form a via hole in a dielectric layer, exposing the top surface of an underlying interconnect metal structure.

It is another object of this invention to form a via hole in a photosensitive, low dielectric constant layer, using direct exposure and development, with the use of masking photoresist shapes.

It is still another object of this invention to form protecting, insulator spacer, on the sides of the via hole that was formed in the photosensitive, low dielectric constant layer.

In accordance with the present invention a process is described for forming a via hole in a photosensitive, low dielectric constant layer, without the use of photoresist processing. An underlying interconnect metal structure is provided, followed by the application of a photosensitive, low dielectric constant layer. A desired via hole pattern is created in a region of the photosensitive, low dielectric layer, via direct exposure. The unexposed region of the photosensitive, low dielectric constant layer is than selectively removed, using wet solvent solutions, resulting in the desired via hole, exposing the top surface of an underlying interconnect metal structure. An chemically deposited insulator layer is next deposited, planarized, and subjected to an anisotropic reactive ion etching, (RIE), procedure, resulting in insulator spacers, on the sides of the via hole, in addition to a remaining portion of the insulator layer, overlying the top surface of the photosensitive, low dielectric constant layer. A metal deposition, used to fill the via hole, now protected with insulator spacers, is than performed.

A second iteration of this invention features the planarization step, performed after deposition of the photosensitive, low dielectric constant layer, followed by patterning procedures comprised of direct exposure and development of the unexposed region of the photosensitive, low dielectric constant layer, resulting in the creation of the via hole. Insulator spacers are again formed on the sides of the via hole, using the same deposition and anisotropic RIE procedures, used with the previous embodiment.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
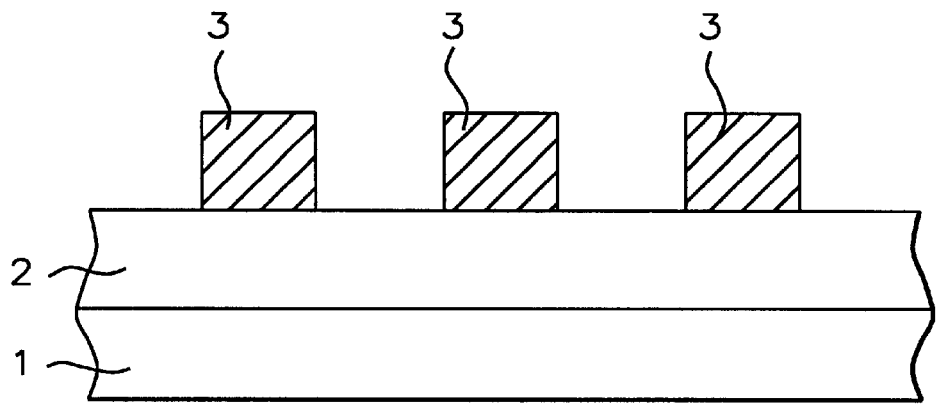
FIGS. 1–8, which schematically, in cross-sectional style, describe a first embodiment of this invention, in which a via hole, protected with insulator spacers, is created in a photosensitive, low dielectric constant layer, without the use of photoresist processing.

The method of forming a via hole, in a photosensitive, low dielectric constant layer, without the use of photoresist masking, will now be described in detail. FIG. 1, schematically shows interconnect metal structures 3, overlying insulator layer 2, on a semiconductor substrate 1. Interconnect metal structures 3, can be used to contact active device regions (not shown in drawings), such as metal oxide semiconductor field effect transistor, (MOSFET), source and drain regions in semiconductor substrate 1, via contact holes, (not shown in drawings), in insulator layer 2. Interconnect metal structures 3, can also be used to contact underlying, interconnect metal structures, (not shown in drawings), underlying insulator layer 2, via use of via holes in insulator layer 2. Semiconductor substrate 1, is comprised of P type, single crystalline silicon, with a <100> crystallographic orientation. Insulator layer 2, can be a silicon oxide layer, obtained using low pressure chemical vapor deposition, (LPCVD), or plasma enhanced chemical vapor deposition, (PECVD), procedures. Insulator layer 2, can also be a boro-phosphosilicate, (BPSG), or a phosphosilicate, (PSG), layer. Interconnect metal structures 3, can be comprised of an aluminum based metal, or a refractory type metal, such as tungsten, formed via plasma deposited, or chemically vapor deposited procedures, followed by patterning procedures consisting of photolithographic and etching procedures.

Figure 2:
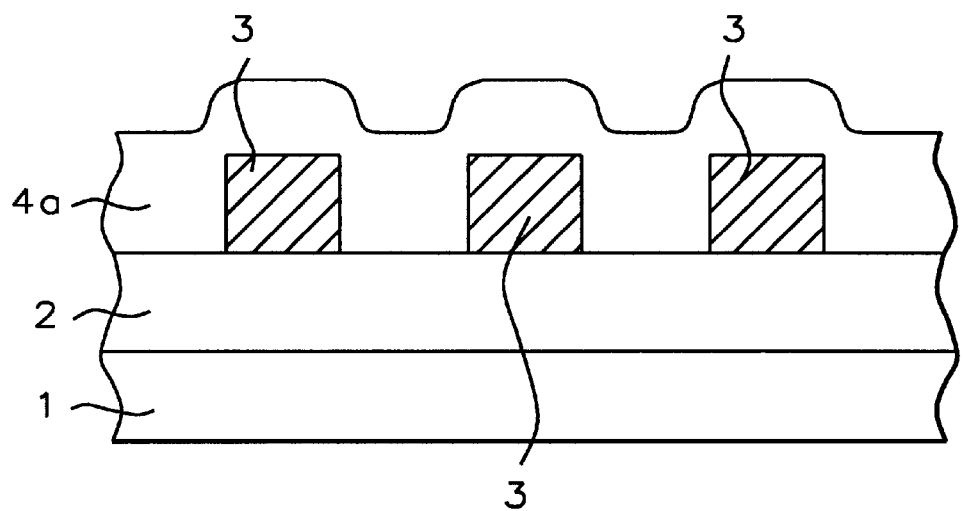
Figure 3:
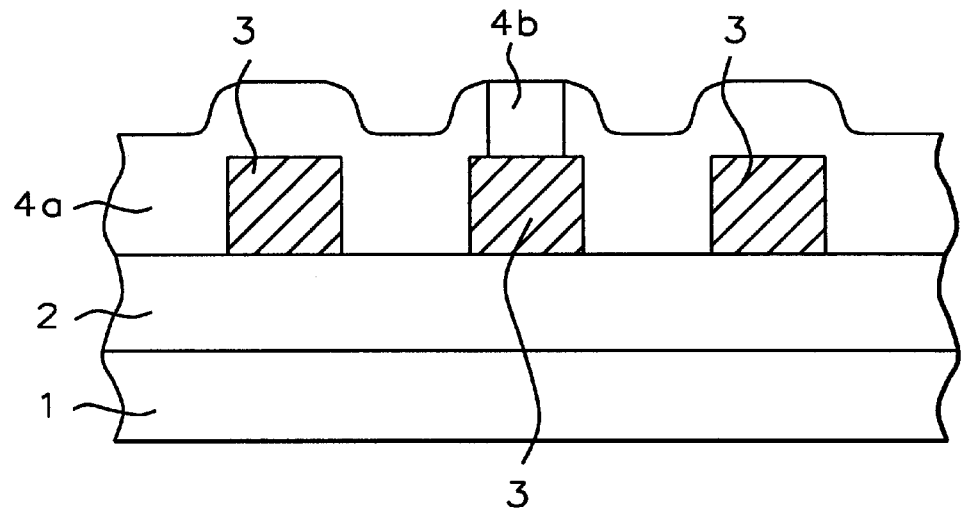
Figure 4:
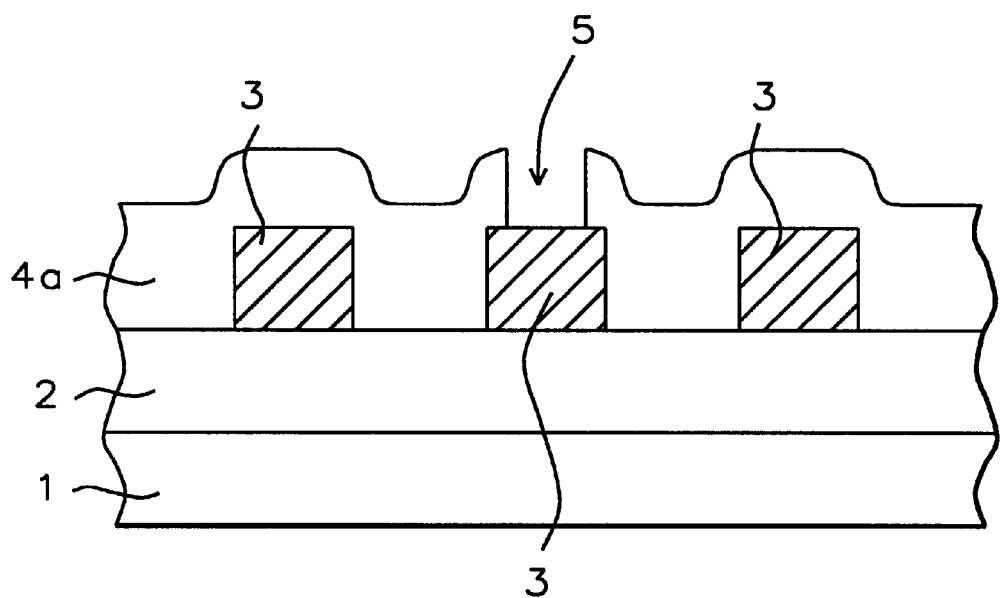

A photosensitive, low dielectric constant layer 4a, shown schematically in FIG. 2, is next applied, to a thickness between about 2000 to 8000 Angstroms. Photosensitive, low dielectric constant layer 4a, can be comprised of either an organic-inorganic hybrid polymer, called "CHEMAT-B", (manufactured by Chemat Technology Inc., Northridge Calif.), or benzocylobutene, (BCB), with the BCB layer being a negative photosensitive layer, that is exposed regions, or cross-linked regions, remain insoluble in a specific solvent, while the non-exposed regions, are removable in the same solvent. These materials, with a dielectric constant between about 2.5 to 3.0, can also be used for insulation between levels of interconnect metal structures. Using the desired chromium photo plate, for each material, CHEMAT-B, or BCB, a direct exposure procedure is performed to a region of layer 4a, exposed in the openings in chromium photo plate, using deep UV for CHEMAT-B layer, at a wavelength between about 190 to 195 nanometers, while a I Line exposure, at a wavelength between about 360 to 370 nanometers, is used for BCB layer, both layers exposed using a dose between about 0 to 800 millijoules/$cm^2$, resulting in the cross-linking of exposed regions of layer 4a, leaving a non-exposed, and non-cross-linked, region 4b, shown schematically in FIG. 3. Non-cross-linked region 4b, is now more soluble in toluene, than the exposed regions of layer 4a, for the CHEMAT-B layer, (and non-crossed-linked region 4b, is now more soluble in mesitylene, than the exposed regions of layer 4a, for the BCB layer). Therefore selective removal of non-cross-linked region 4b, is accomplished using either mesitylene, or toluene, resulting in the creation of via hole 5, shown schematically in FIG. 4. Via hole 5 exposing the top surface of interconnect metal structure 3, was created without the use of photoresist masking. Previously used conventional photoresist processing comprises creation of the desired via hole image in a photoresist layer, followed by the transfer of this image to an underlying insulator layer, via a dry etching procedure. This costly process is than continued with the removal of the masking photoresist layer, using plasma oxygen ashing procedures. The ashing procedure can result in unwanted oxidation, as well as damage to, the underlying interconnect metal structure, now exposed at the bottom of the via hole. The use of a photosensitive, low dielectric constant layer, that remains as part of the structure, reduces the cost of photoresist processing, as well as eliminating deleterious oxidation, and damage, to exposed metal structures.

Figure 5:
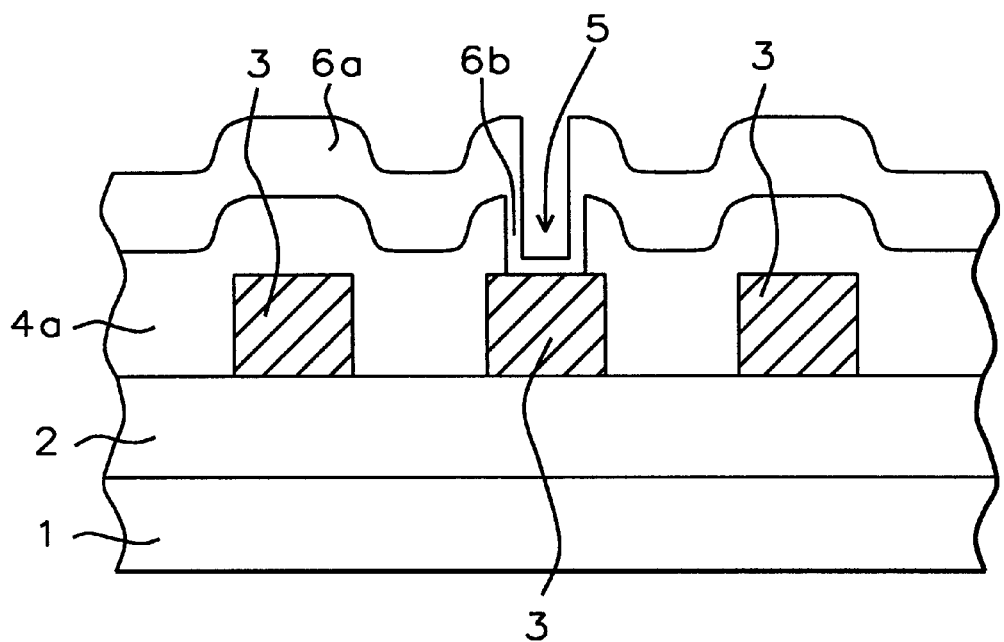
Figure 6:
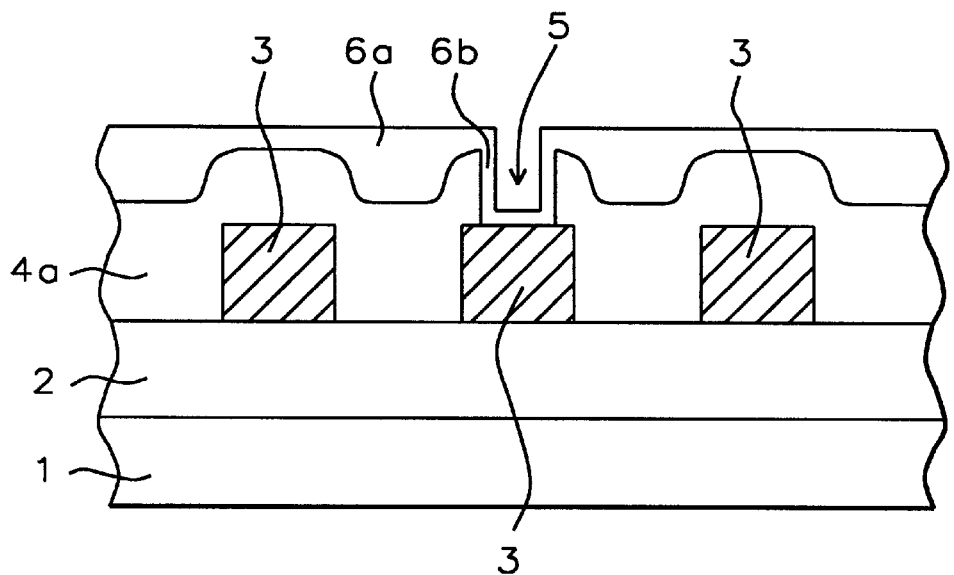
Figure 7:
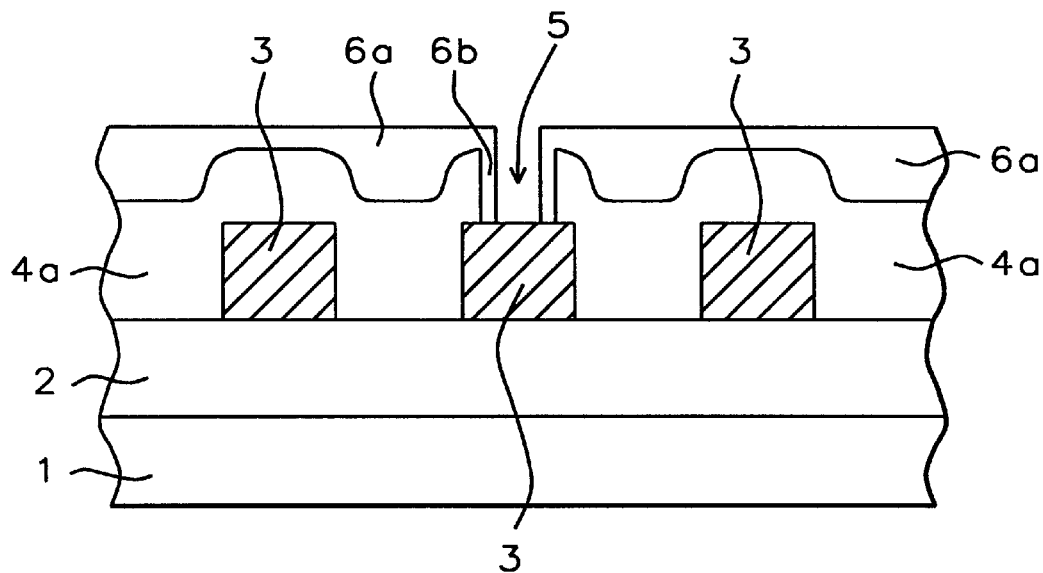

Procedures used to passivate and protect photosensitive, low dielectric constant layer 4a, from interfacing materials and processes, are next addressed and schematically shown in FIGS. 5–8. An insulator layer, comprised of silicon oxide, is next deposited using PECVD or high density plasma chemical vapor deposition, (HDPCVD), procedures. Insulator layer 6a, is deposited on the top surface of photosensitive, low dielectric layer 4a, at a thickness between about 2000 to 8000 Angstroms, while the same CVD procedure results in the deposition of insulator layer 6b, at a thickness between about 200 to 1000 Angstroms, on the exposed surfaces of photosensitive, low dielectric layer 4a, in via hole 5. This is schematically shown in FIG. 5. A chemical mechanical polishing, (CMP), procedure is next used for surface planarization, resulting in the smooth top surface of insulator layer 6a, with insulator layer 6a, also filling the low spaces in the uneven topography creating by photosensitive, low dielectric constant layer 4a, traversing underlying interconnect metal structures 3. This is schematically shown in FIG. 6.

Figure 8:
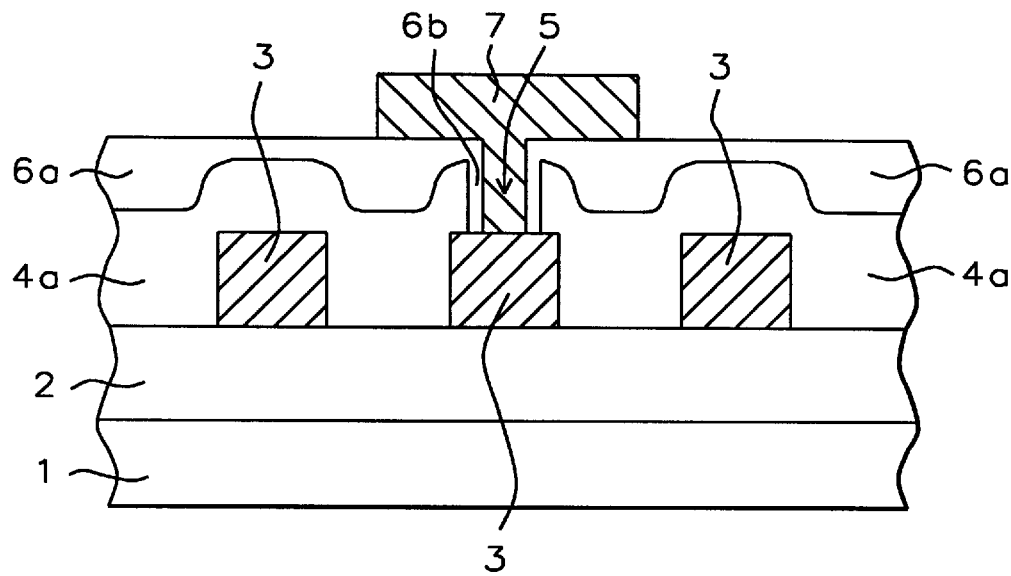

An anisotropic RIE procedure, using $CHF_3$ as an etchant, is used to remove insulator 6b, from the bottom of via hole 5, forming insulator spacers 6b, on the sides of via hole 5, and exposing the top surface of interconnect metal structure 3. This is shown schematically in FIG. 7. An overlying interconnect metal structure 7, shown schematically in FIG. 8, is next formed, contacting underlying interconnect metal structure 3, in via hole 5. Overlying interconnect metal structure 7, can be comprised of an aluminum based layer, deposited using R.F. sputtering procedures, and patterned using conventional photolithographic and RIE procedures, using $Cl_2$ as an etchant. Overlying interconnect metal structure 7, can also be a refractory type metal, such as tungsten, deposited using LPCVD procedures, and again patterned via conventional photolithographic and RIE procedures. All regions of photosensitive, low dielectric constant layer 4a, are now protected from interconnect metal structure 7, and from the process steps used to create interconnect metal structure 7, by insulator spacers 6b, in via hole 5, and by insulator layer 6a, on the top surface of photosensitive, low dielectric constant layer 4a.

Figure 9:
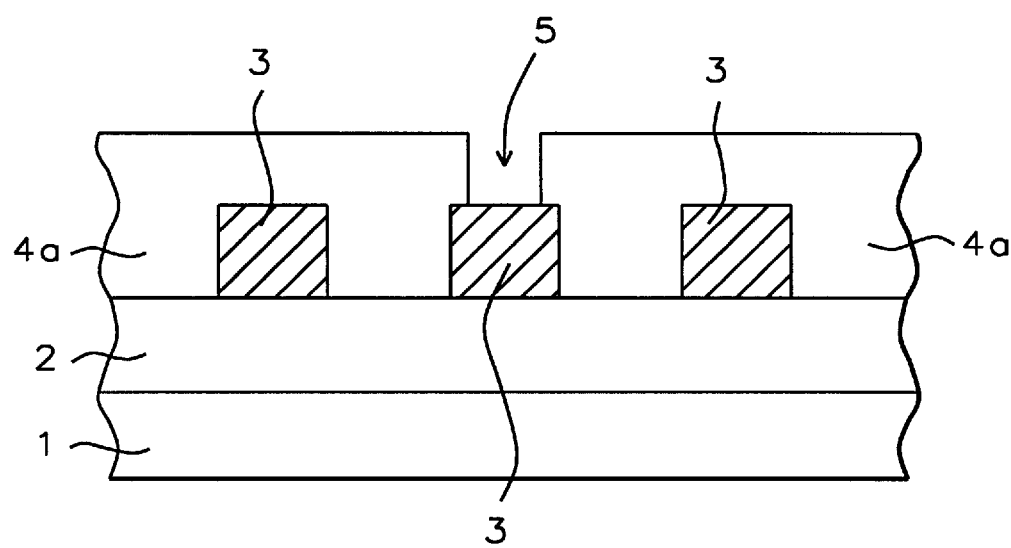
FIGS. 9–11, which schematically, in cross-sectional style, describe a second embodiment of this invention, in which the planarization of the photosensitive, low dielectric constant layer, is performed prior to creation of the via hole.
Figure 10:
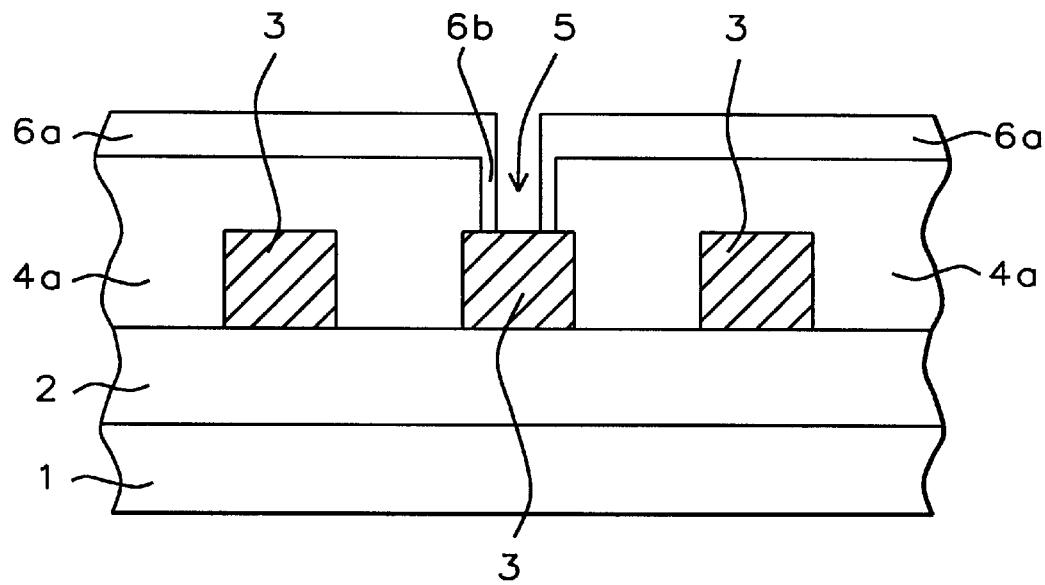
Figure 11:
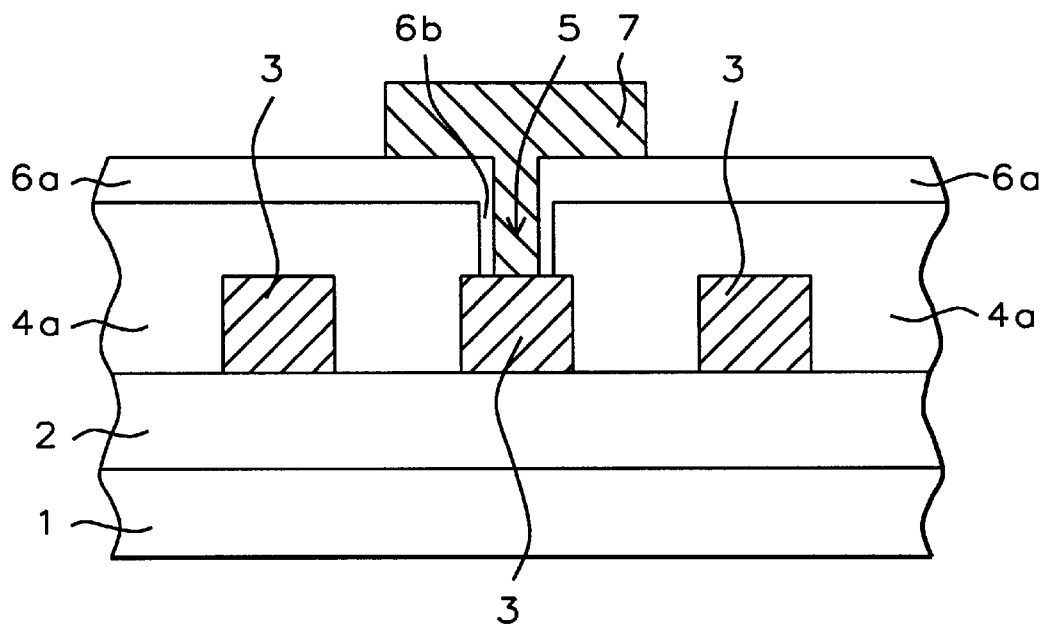

A second embodiment of this invention, featuring the planarization of photosensitive, low dielectric constant layer 4a, prior to insulator deposition, and formation of insulator spacers, in via hole 5, is described schematically using FIGS. 9–11. FIG. 9, schematically shows the result of a CMP procedure, applied to photosensitive, low dielectric constant layer 4a, after creation of via hole 5. The uneven top surface topography, created by the application of photosensitive, low dielectric constant layer 4a, traversing underlying interconnect metal structures 3, and the spaces between these structures, is now smoothed via the CMP procedure. The deposition of a silicon oxide layer, on the sides of via hole 5, again using PECVD or HDPCVD procedures, followed by an anisotropic RIE procedure, again using $CHF_3$ as an etchant, is used to create insulator spacers 6b, on the sides of via hole 5, and result in insulator layer 6a, residing on the top surface of the planarized, photosensitive, low dielectric constant layer 4a. This is schematically shown in FIG. 10. The thickness of the silicon oxide layer 6a, deposited on the top surface of photosensitive, low dielectric constant layer 4a, is between about 2000 to 8000 Angstroms, while the thickness of silicon oxide layer 6b, on the sides of via hole 5, is between about 200 to 1000 Angstroms. The formation of overlying interconnect metal structure 7, contacting underlying interconnect metal structure 3, in via hole 5, is schematically shown in FIG. 11. Interconnect metal structure 7, is formed using the identical materials and processes used for the first embodiment of this invention. Again the advantage of gained using a non-photoresist process, for creation of via hole 5, is not compromised by exposure of the material, photosensitive, low dielectric constant layer 4a, to subsequent overlying materials and processes, via the use of insulator spacers 6b, and insulator layer 6a.

While this invention has been particularly shown and described with reference to, the preferred embodiments thereof, it will be understood by those skilled in the art that various changes in form and details may be made without departing from the spirit and scope of this invention.

What is claimed is:

1. A method for forming a via hole in a photosensitive low dielectric constant layer, on a semiconductor substrate, with said via hole formed without the use of photoresist patterning procedures, and with said via hole then protected with silicon oxide spacers, comprising:

providing said semiconductor substrate containing active device regions and providing a dielectric layer, overlying active device regions;

forming a first interconnect metal structure on said dielectric layer;

applying said photosensitive low dielectric constant layer on said first interconnect metal structure and on said dielectric layer, in regions in which said underlying dielectric layer is not covered by said first interconnect metal structure;

directly exposing a first portion of said photosensitive low dielectric constant layer to a light source, forming a non-soluble material in said first portion of said low dielectric constant layer, leaving a non-exposed, soluble region in a second portion of said photosensitive low dielectric constant layer, directly overlying said first metal interconnect structure;

selectively removing soluble material from said second portion of said photosensitive low dielectric constant layer, creating said via hole in said photosensitive low dielectric constant layer, exposing the top surface of said first interconnect metal structure;

depositing a silicon oxide layer, with a thick portion of said silicon oxide layer deposited on the top surface of said photosensitive low dielectric constant layer, and with a thin portion of said silicon oxide layer deposited on the sides of the photosensitive low dielectric constant layer exposed in said via hole, and on the top surface of said first interconnect metal structure exposed in said via hole;

planarizing to create a smooth top surface topography in regions in which said silicon oxide layer overlays said photosensitive low dielectric constant layer;

performing a blanket, anisotropic dry etching to remove said thin portion of said silicon oxide layer from the top surface of said first interconnect metal structure exposed in said via hole, forming said silicon oxide spacers on the sides of said via hole, while leaving a segment of said thick portion of said silicon oxide layer remaining on the top surface of said photosensitive low dielectric layer, creating a silicon oxide protected via hole, located in said photosensitive low dielectric constant layer; and forming a second interconnect metal structure, with a first portion of said second interconnect metal structure in said silicon oxide protected via hole, and with a second portion of said second interconnect metal structure on said silicon oxide layer, in a region in which said silicon oxide layer overlays the top surface of said photosensitive low dielectric layer.

2. The method of claim 1, wherein said active device regions can be source drain regions in said semiconductor substrate.

3. The method of claim 1, wherein said active device regions are metal structures.

4. The method of claim 1, wherein said first interconnect metal structure can be an aluminum based metal structure, or a tungsten metal structure.

5. The method of claim 1, wherein said photosensitive low dielectric constant layer is a benzocylobutene layer, applied to a thickness between about 2000 to 8000 Angstroms, and with a dielectric constant between about 2.5 to 3.0.

6. The method of claim 1, wherein direct exposure of said photosensitive low dielectric layer, is performed at a wavelength between about, and at a wavelength between 360 to 370 nanometers for BCB, and exposed at a dose between about 0 to 800 millijoules, creating said non-soluble material.

7. The method of claim 1, wherein said soluble material is selectively removed using mesitylene as a solvent, for the non-exposed regions of the BCB layer, creating said via hole.

8. The method of claim 1, wherein said silicon oxide layer is deposited using PECVD or HDPCVD procedures, to a thickness between about 2000 to 8000 Angstroms, on the top surface of said photosensitive low dielectric constant layer, and to a thickness between about 200 to 1000 Angstroms, on said photosensitive low dielectric constant layer, exposed on the sides of said via hole.

9. The method of claim 1, wherein silicon oxide spacers are formed, on the sides of said via hole, using an anisotropic RIE procedure, using $CHF_3$ as an etchant.

10. The method of claim 1, wherein said second interconnect metal structure can be an aluminum based metal structure, or a tungsten metal structure.

11. A method of fabricating a silicon oxide protected via hole in a photosensitive low dielectric constant layer, via initial creation of a via hole in said photosensitive low dielectric constant layer, formed without using photoresist procedures, and finalized with silicon oxide spacers, formed on the sides of said via hole in said photosensitive low dielectric constant layer, comprising:

forming a first metal interconnect structure on an underlying insulator layer;

depositing said photosensitive low dielectric constant layer on said first metal interconnect structure and on regions of said underlying insulator layer not covered by said first metal interconnect structure;

chemical mechanical polishing creating a smooth top surface topography for said photosensitive low dielectric constant layer;

exposing a first region of said photosensitive low dielectric constant layer to a light source, forming a non-soluble material in said first region of said photosensitive low dielectric constant layer while leaving a second region of said photosensitive low dielectric constant layer unexposed, wherein said second region is directly overlying said first interconnect metal structure;

selectively removing unexposed, said second region of said photosensitive low dielectric constant layer creating said via hole in said photosensitive low dielectric constant layer, exposing the top surface of said first interconnect metal structure;

depositing a silicon oxide layer wherein the thickness of a first portion of said silicon oxide layer deposited on the top surface of said photosensitive low dielectric constant layer is 2000 to 8000 Angstroms, while the thickness of a second portion of said silicon oxide layer deposited on the sides of said photosensitive low dielectric layer, exposed in said via hole, and deposited on the top surface of said first interconnect metal structure, exposed in said via hole, is only between about 200 to 1000 Angstroms;

blanket, anisotropic etching removing said second portion of said silicon oxide layer from the top surface of said first interconnect structure, creating said silicon oxide spacers on the sides of said via hole, while leaving a segment of said first portion of said silicon oxide layer on the top surface of said photosensitive low dielectric constant layer, resulting in the formation of said silicon oxide protected via hole; and forming a second interconnect metal structure contacting the top surface of said first interconnect metal structure, in said silicon oxide protected via hole.

12. The method of claim 11, wherein said first interconnect metal structure can be an aluminum based metal structure, or a tungsten metal structure.

13. The method of claim 11, wherein said photosensitive low dielectric constant layer is benzocylobutene, with a dielectric constant between about 2.5 to 3.0, applied at a thickness between about 2000 to 8000 Angstroms.

14. The method of claim 11, wherein said soluble material is created via direct exposure of a region of said photosensitive low dielectric constant layer, at a wavelength between about 360 to 370 nanometers for BCB, using a dose of between about 0 to 800 millijoules.

15. The method of claim 11, wherein said via hole in said photosensitive low dielectric layer is formed via select removal of said soluble material, using mesitylene as a solvent for non-exposed regions of BCB.

16. The method of claim 11, wherein said silicon oxide layer, on the sides of said via hole, is obtained using PECVD or HDPCVD procedures, to a thickness between about 200 to 1000 Angstroms.

17. The method of claim 11, wherein said silicon oxide spacers are formed on the sides of said via hole, via an anisotropic RIE procedure, applied to said silicon oxide layer, using $CHF_3$ as an etchant.

18. The method of claim 11, wherein said second interconnect metal structure is a aluminum based metal structure, or a tungsten metal structure.

* * * * *